(12) United States Patent
Bowden

(10) Patent No.: US 11,630,139 B2
(45) Date of Patent: Apr. 18, 2023

(54) SYSTEM AND METHOD FOR WIDEBAND SPECTRAL ESTIMATION USING JOINT SPACE-TIME ARRAY MANIFOLD VECTORS

(71) Applicant: Raytheon Company, Waltham, MA (US)

(72) Inventor: James M. Bowden, Forney, TX (US)

(73) Assignee: Raytheon Company, Waltham, MA (US)

( * ) Notice: Subject to any disclaimer, the term of this patent is extended or adjusted under 35 U.S.C. 154(b) by 252 days.

(21) Appl. No.: 17/072,989

(22) Filed: Oct. 16, 2020

(65) Prior Publication Data

US 2022/0120673 A1    Apr. 21, 2022

(51) Int. Cl.
  *G01R 23/175*  (2006.01)
(52) U.S. Cl.
  CPC .................................. *G01R 23/175* (2013.01)
(58) Field of Classification Search
  CPC .............. H01Q 21/0025; H01Q 3/2605; G01S 13/0209; G01S 13/767; G01S 13/878; G01S 3/74; G01S 5/0215; G01S 5/0273; G01S 5/06; G01S 7/292; G01S 7/32; G01S 7/411; G01R 23/175
  See application file for complete search history.

(56) References Cited

U.S. PATENT DOCUMENTS

| | | | | |
|---|---|---|---|---|
| 6,115,409 A * | 9/2000 | Upadhyay | ................ | H04B 1/71 375/267 |
| 7,876,869 B1 * | 1/2011 | Gupta | .................... | H04B 1/109 455/150.1 |
| 8,457,579 B2 * | 6/2013 | Mishali | ................ | H04B 1/0092 455/168.1 |
| 8,717,210 B2 * | 5/2014 | Eldar | .................... | H03M 1/121 341/122 |
| 8,836,557 B2 * | 9/2014 | Eldar | ..................... | H03M 7/30 341/122 |

(Continued)

OTHER PUBLICATIONS

Doron, Miriam A., et al., "On Focusing Matrices for Wide-Band Array Processing", IEEE Transactions on Signal Processing, vol. 40, No. 6, (Jun. 1992), 1295-1302.

(Continued)

*Primary Examiner* — Mohammad K Islam
(74) *Attorney, Agent, or Firm* — Schwegman Lundberg & Woessner, P.A.

(57) ABSTRACT

Embodiments of systems and method for determining a joint space-time spectral estimate (P) for a wideband spectrum are generally described herein. To determine a joint space-time spectral estimate (P) for a wideband spectrum, a random time delay may be applied to received signals for each channel of a plurality of receive channels to generate time-delayed signals for each receive channel. The time-delayed signals may be sampled for each receive channel to generate time-delayed samples and form array manifold vectors based on the random time delays and position of each antenna element in an array of antenna elements. An inverse (Q) of the joint-space time spectral estimate (P) may be determined by projecting the array manifold vectors through a mixing matrix (M). The mixing matrix (M) may be based on the time-delayed samples. The joint space-time spectral estimate (P) may comprise spatial and temporal properties of the wideband spectrum.

20 Claims, 5 Drawing Sheets

(56) References Cited

U.S. PATENT DOCUMENTS

| | | | | |
|---|---|---|---|---|
| 9,020,079 | B2* | 4/2015 | Gupta | H04B 1/123 |
| | | | | 375/343 |
| 9,143,194 | B2* | 9/2015 | Eldar | H03H 17/06 |
| 10,379,215 | B1* | 8/2019 | Roovers | G01S 13/878 |
| 2003/0064737 | A1* | 4/2003 | Eriksson | H04L 27/2614 |
| | | | | 455/501 |
| 2005/0122256 | A1* | 6/2005 | Szajnowski | G01S 7/292 |
| | | | | 342/175 |
| 2007/0064744 | A1* | 3/2007 | Aytur | H04L 27/2656 |
| | | | | 370/503 |
| 2018/0083816 | A1* | 3/2018 | Bolstad | H04L 27/265 |
| 2019/0124648 | A1* | 4/2019 | Sun | H04W 72/0433 |

OTHER PUBLICATIONS

Yang, Yixin, et al., "Wideband Sparse Spatial Spectrum Estimation Using Matrix Filter with Nulling in a Strong Interference Environment", The Journal of the Acoustical Society of America 143 (6), (Jun. 2018), 3891-3898.

Zhang, Q.T., "A Statistical Resolution Theory of the Beamformer-Based Spatial Spectrum for Determining the Directions of Signals in White Noise", IEEE Transactions on Signal Processing, vol. 43, No. 8, (Aug. 1995), 1867-1873.

* cited by examiner

SYSTEM AND METHOD FOR WIDEBAND SPECTRAL ESTIMATION USING JOINT SPACE-TIME ARRAY MANIFOLD VECTORS

TECHNICAL FIELD

Embodiments pertain to signal identification in a wideband spectrum. Some embodiments pertain to determining angle-of-arrival (AOA), frequency and bandwidth characteristics of the identified signals.

BACKGROUND

One issue with conventional wideband spectral estimation techniques is that they necessarily have to channelize input data prior to performing spatial-spectral estimation. This is because the array manifold vectors are defined at a specific signal frequency which creates errors when the signal frequency is not equal to the frequency used in the array manifold vector for the spatial-spectral estimation technique. Furthermore, wideband signals that extend through channels have challenges as they are processed in separate channels and have to be stitched back together or reconciled prior to reporting angle of arrival.

Thus, there are general needs for improved wideband spectral estimation.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments disclosed herein utilize the joint space-time relationship of electromagnetic waves to define array manifold vectors in 4-dimensional space and overcome the lack of sample diversity in the z-dimension for planar arrays by introducing a known random time delay in each channel of the receiving array. Some embodiments perform 4-dimensional processing of incoming electromagnetic waves. Some embodiments perform Latin hypercube sampling of the k-space to determine array manifold vectors. Some embodiments perform randomized channel-to-channel delays prior to the formation of the covariance matrix utilized in spectral-estimation techniques. These embodiments are discussed in more detail below.

Figure 1:
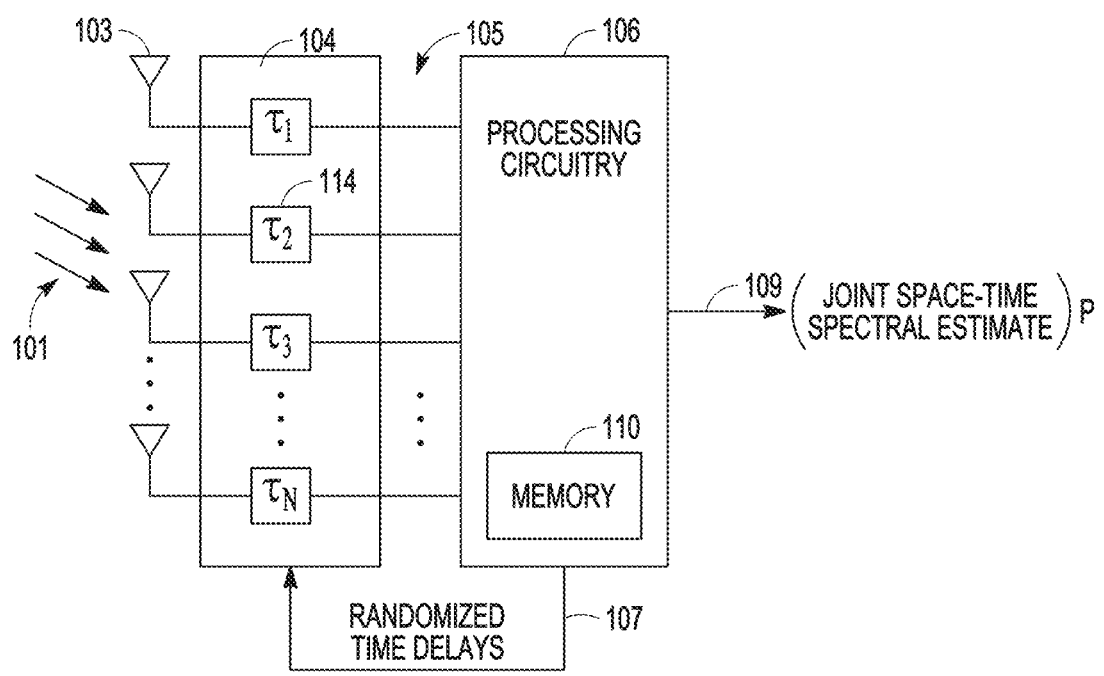
FIG. 1 is a functional diagram of a system for performing a joint space-time spectral estimate in accordance with some embodiments.

FIG. 1 is a functional diagram of a system for performing a joint space-time spectral estimate in accordance with some embodiments. In accordance with embodiments, system 100 is configured for joint space-time spectral estimation. In these embodiments, the system 100 may include processing circuitry 106 and memory 110. In these embodiments, to determine a joint space-time spectral estimate (P) for a wideband spectrum, the processing circuitry 106 may apply a random time delay (tn) 107 to received signals 101 for each channel of a plurality of receive channels to generate time-delayed signals 105 for each receive channel. In these embodiments, the processing circuitry 106 may also sample the time-delayed signals 105 for each receive channel to generate time-delayed samples (Xn), and form array manifold vectors based on the random time delays and position of each antenna element 102 in the array of antenna elements. The processing circuitry 106 may also determine an inverse (Q) of the joint-space time spectral estimate (P) 109 by projecting the array manifold vectors through a mixing matrix (M). The mixing matrix (M) may be based on the time-delayed samples (Xn). The joint space-time spectral estimate (P) 109 may comprise spatial and temporal properties of the wideband spectrum.

In some embodiments, the processing circuitry 106 may form the array manifold vectors in k-space (i.e., wave number space), each manifold vector having a length (m) corresponding with a number of channels.

In some embodiments, each receive channel may comprise a same wideband frequency spectrum. Each receive channel may be associated with one antenna element 102 of the array of antenna elements. For each receive channel, one of the random time delays may be applied to the received signals of the associated receive channel.

In some embodiments, the processing circuitry 106 may compute the inverse (Q) of the joint-space time spectral estimate (P) by projecting the array manifold vectors through the mixing matrix (M) yields. In some embodiments, the processing circuitry 106 may invert the inverse (Q) of the joint-space time spectral estimate (P) to obtain the joint-space time spectral estimate (P) 109.

In some embodiments, the processing circuitry 106 may form a sample covariance matrix (Sxx) from the time-delayed samples (Xn) and invert the sample covariance matrix to form the mixing matrix (M). In these embodiments, the sample covariance matrix (Sxx) may be an N×N Hermitian matrix.

In some embodiments, the processing circuitry 106 may identify signals (see FIGS. 3A and 3B) within the wideband spectrum based on the joint-space time spectral estimate (P) 109. In some embodiments, the processing circuitry 106 may determine an angle-of-arrival (AOA) and determine frequency and bandwidth characteristics of the identified signals based on the joint-space time spectral estimate (P) 109.

In some embodiments, the system may further comprise delay circuitry 104. The delay circuitry 104 may comprise a discrete time delay unit (TDU) 114 for each receive channel. Each of the TDUs may be configured to delay signals within one of the receive channels by the random time delay (tn) for that receive channel. In some embodiments, the discrete delay times are randomly set using control words to yield different delay times, although the scope of the embodiments is not limited in this respect.

In some embodiments, each array manifold vector (Vn) is computed using the following equation:

$$v_n = e^{j(k^T p_n - K \cdot c_{light} \tau_n)}$$

where $p_n$ represents position vectors corresponding to a position of an element, k represents the k-space vectors, K is the wavenumber, and $t_n$ represents the random time delay applied to a receive channel.

In some embodiments, the memory 110 may store the random time delay ($\tau_n$) for each receive channel.

Figure 2:
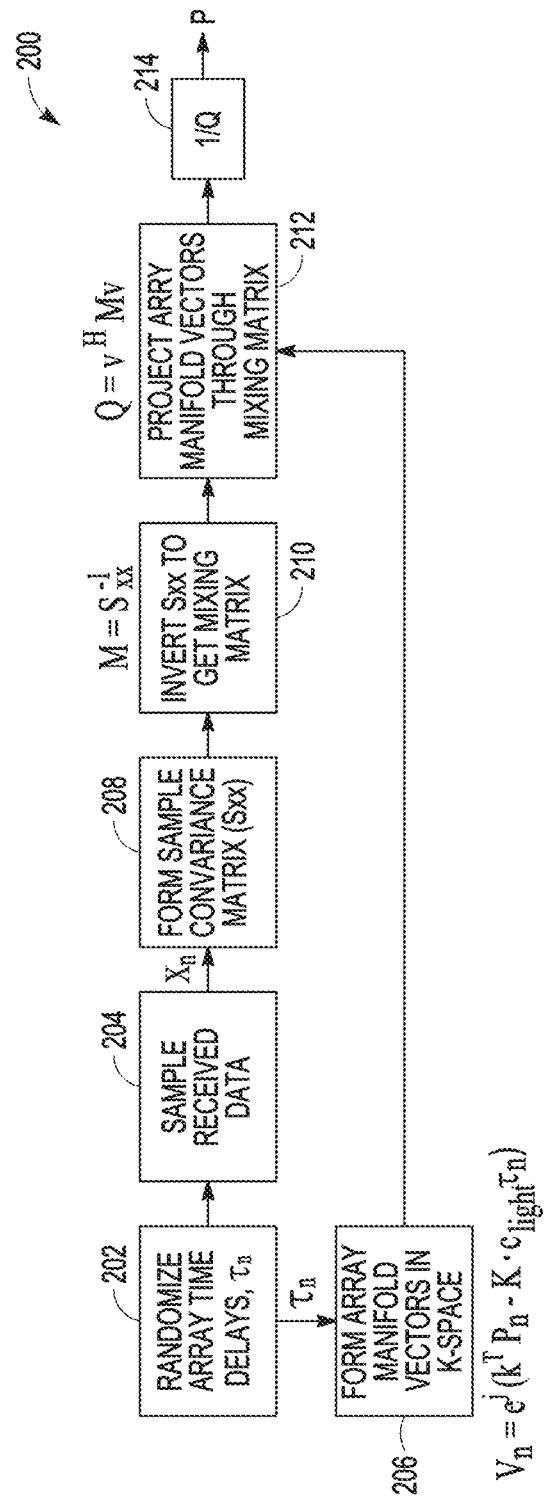
FIG. 2 is a procedure for performing a joint space-time spectral estimate in accordance with some embodiments.

FIG. 2 is a procedure for performing a joint space-time spectral estimate in accordance with some embodiments. In accordance with embodiments, operation 202 may comprise applying a random time delay (tn) to received signals 101 (FIG. 1) for each channel of a plurality of receive channels to generate time-delayed signals 105 (FIG. 1) for each receive channel. Operation 204 may include sampling the time-delayed signals 105 for each receive channel to generate time-delayed samples (Xn). Operation 206 may include forming array manifold vectors based on the random time delays and position of each antenna 102 (FIG. 1) element in an array of antenna elements. Operation 212 may comprise determining an inverse (Q) of the joint-space time spectral estimate (P) 109 by projecting the array manifold vectors through a mixing matrix (M). The mixing matrix (M) may be based on the time-delayed samples (Xn). In these embodiments, the joint space-time spectral estimate (P) comprises spatial and temporal properties of the wideband spectrum.

In these embodiments, the inverse (Q) of the joint-space time spectral estimate (P) may be computed in operation 212 by projecting the array manifold vectors through the mixing matrix (M) yields and operation 214 may comprise inverting the inverse (Q) of the joint-space time spectral estimate (P) to obtain the joint-space time spectral estimate (P).

In some embodiments, operation 208 may comprise forming a sample covariance matrix (Sxx) from the time-delayed samples (Xn) and operation 210 may comprise inverting the sample covariance matrix to form the mixing matrix (M).

In some embodiments, operations 208, 210, 212 and 214 may form the high-resolution spectrum as described by J. Capon, "High-resolution frequency-wavenumber spectrum analysis," *Proc IEEE*, vol 57, pp 1408-1418, August 1969, although the scope of the embodiments is not limited in this respect.

Figure 3A:
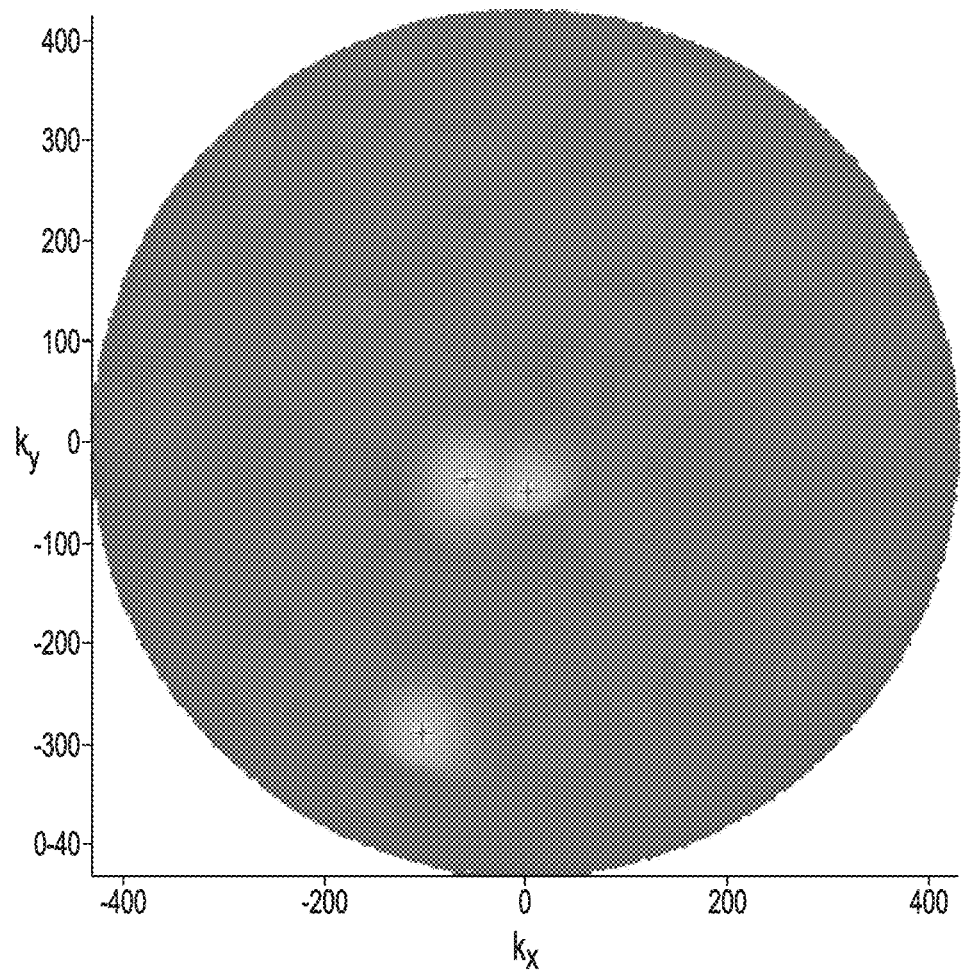
FIG. 3A illustrates the spatial properties of identified signals in accordance with some embodiments.

FIG. 3A illustrates the spatial properties of identified signals in accordance with some embodiments.

Figure 3B:
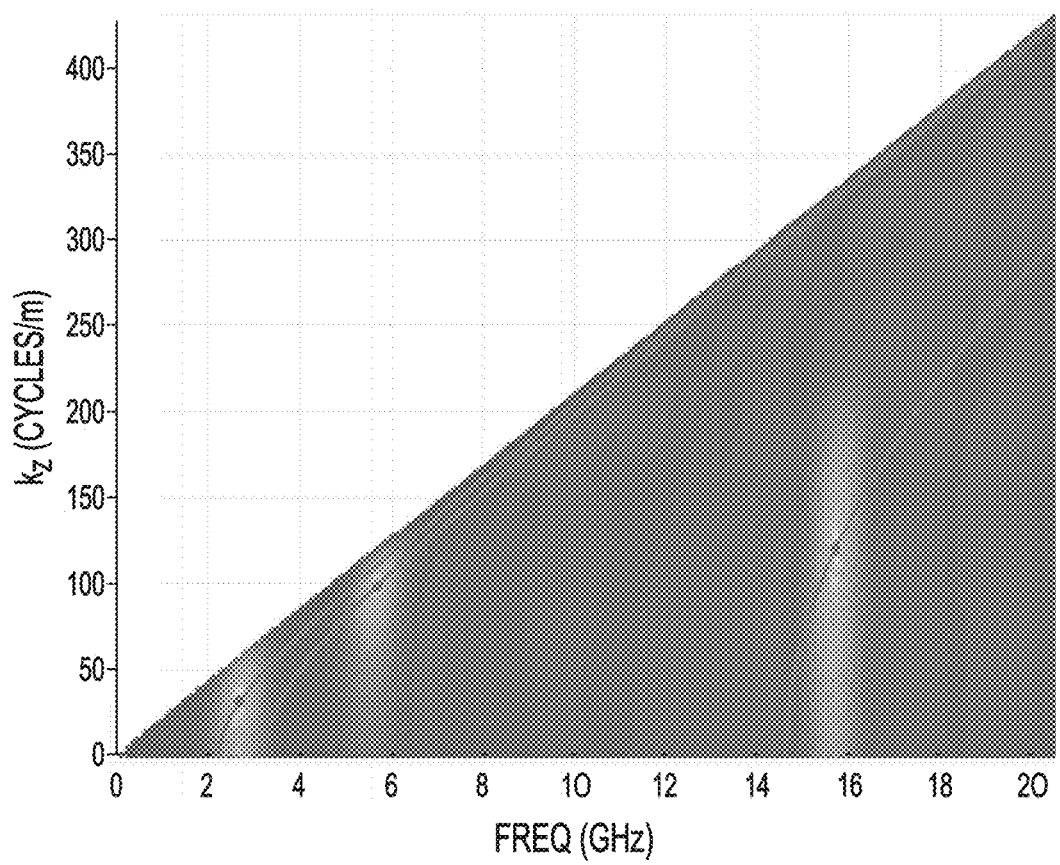
FIG. 3B illustrates the frequency properties of the identified signals of FIG. 3A, in accordance with some embodiments.

FIG. 3B illustrates the frequency properties of the identified signals of FIG. 3A, in accordance with some embodiments.

Figure 4:
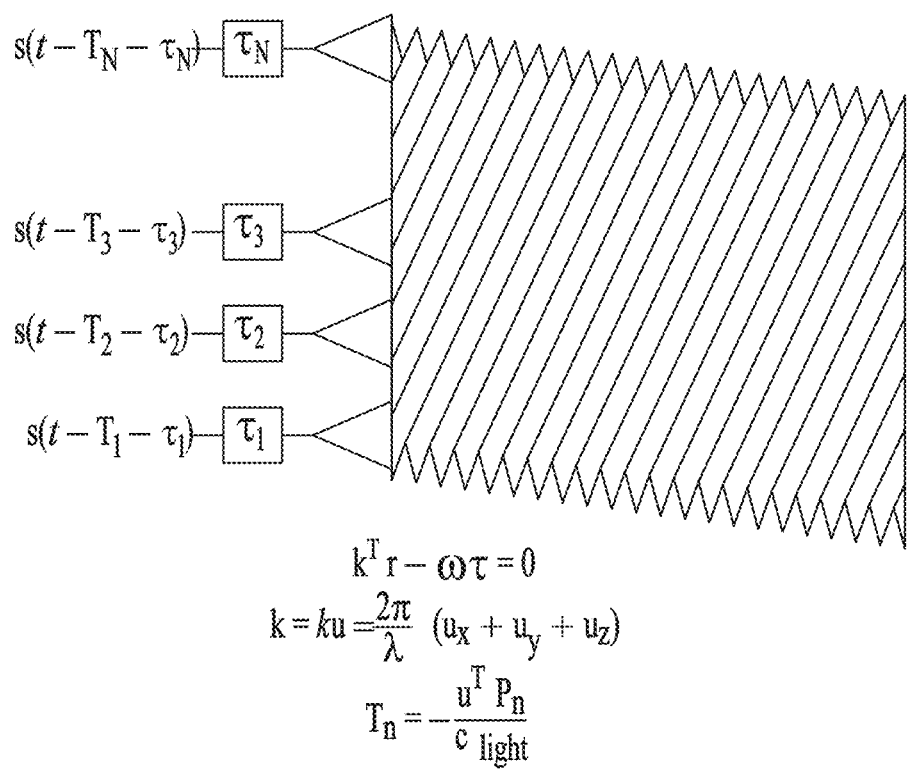
FIG. 4 illustrates wave propagation in accordance with some embodiments.

FIG. 4 illustrates wave propagation in accordance with some embodiments. As illustrated in FIG. 4, an incident electromagnetic wave (normal vector n) may be incident on an antenna array of individual elements. The joint space-time definition for electromagnetic wave propagation may be written as follows:

$$e(r,t) \cong E \cdot e^{j(k^T r - \omega t)}$$

At an array whose location is at r at time t the signal at channel n can be expressed as:

$$e_n(r,t) \cong E \cdot e^{j(k^T p_n - \omega \tau_n)} e^{j(k^T r - \omega t)} \cong E \cdot e^{j(k^T p_n - \omega \tau_n)} e^{j\phi}$$

In these embodiments, the array manifold vector can be re-written as:

$$v_n(r,t) = e^{j(k^T p_n - \omega \tau_n)}$$

In these embodiments, the time delay, $t_n$, (see FIG. 4) is randomized at every channel and the array response in four-dimensions can be examined.

$$k^T r - \omega \tau = 0$$

$$k = k\mu = \frac{2\pi}{\lambda}(u_x + u_y + u_z)$$

$$T_n = -\frac{u^T p_n}{c_{light}}$$

Accordingly, a joint-space time spectral estimate (P) 109 may be determined by projecting the array manifold vectors through a mixing matrix (M) which is based on time-delayed samples (Xn) of the received signals.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system for joint space-time spectral estimation, the system comprising:
   processing circuitry;
   delay circuitry comprising a discrete time delay unit (TDU) for each channel of a plurality of receive channels; and
   memory,
   wherein to determine a joint space-time spectral estimate (P) for a wideband spectrum, the processing circuitry is configured to:
   provide a random time delay (tn) for each channel of a plurality of receive channels to be applied to received signals by the TDUs of the delay circuitry to generate time-delayed signals for each receive channel, the received signals received by an array of antenna elements coupled to the delay circuitry;
   sample the time-delayed signals for each receive channel to generate time-delayed samples (Xn);
   form array manifold vectors based on the random time delays and position of each antenna element in the array of antenna elements;
   determine an inverse (Q) of the joint-space time spectral estimate (P) by projecting the array manifold vectors through a mixing matrix (M), the mixing matrix (M) based on the time-delayed samples (Xn),
   wherein the joint space-time spectral estimate (P) comprises spatial and temporal properties of the wideband spectrum; and
   report an output comprising an angle-of-arrival (AOA) based on joint space-time spectral estimate (P).

2. The system of claim 1, wherein the processing circuitry is configured to form the array manifold vectors in k-space, each manifold vector having a length (m) corresponding with a number of channels.

3. The system of claim 2, wherein each receive channel comprises a same wideband frequency spectrum, each receive channel is associated with one antenna element of the array of antenna elements, and wherein for each receive channel, one of the random time delays is applied to the received signals of the associated receive channel.

4. The system of claim 3, wherein the processing circuitry is configured to compute the inverse (Q) of the joint-space time spectral estimate (P) by projecting the array manifold vectors through the mixing matrix (M) yields, and
wherein the processing circuitry is further configured to invert the inverse (Q) of the joint-space time spectral estimate (P) to obtain the joint-space time spectral estimate (P).

5. The system of claim 4, wherein the processing circuitry is further configured to:
form a sample covariance matrix (Sxx) from the time-delayed samples (Xn); and
invert the sample covariance matrix to form the mixing matrix (M).

6. The system of claim 5, wherein the processing circuitry is further configured to identify signals within the wideband spectrum based on the joint-space time spectral estimate (P).

7. The system of claim 6, wherein the processing circuitry is further configured to determine the AOA angle-of-arrival (AOA) and determine frequency and bandwidth characteristics of the identified signals based on the joint-space time spectral estimate (P).

8. The system of claim 7 wherein each of the TDUs is configured to delay signals within one of the receive channels by the random time delay (tn) provided by the processing circuitry for that receive channel.

9. The system of claim 2, wherein each array manifold vector (Vn) is computed using the following equation:

$$v_n = e^{j(k^T p_n - K \cdot c_{light} \tau_n)}$$

wherein $p_n$ represents position vectors corresponding to the position of an antenna element, k represents the array manifold vectors in k-space vectors, K is a wavenumber, and $t_n$ represents the random time delay applied to a receive channel.

10. The system of claim 1 wherein the memory is configured to store the random time delay ($t_n$) for each receive channel.

11. A method for determining a joint space-time spectral estimate (P) for a wideband spectrum, the method comprising:
receiving signals by an array of antenna elements;
providing, by processing circuitry a random time delay ($t_n$) for each channel of a plurality of receive channels to be applied to received signals by discrete time delay units (TDUs) of delay circuitry to generate time-delayed signals for each receive channel, the delay circuitry coupled to the array;
sampling the time-delayed signals for each receive channel to generate time-delayed samples (Xn);
forming array manifold vectors based on the random time delays and position of each antenna element in the array of antenna elements;
determining an inverse (Q) of the joint-space time spectral estimate (P) by projecting the array manifold vectors through a mixing matrix (M), the mixing matrix (M) based on the time-delayed samples (Xn),
wherein the joint space-time spectral estimate (P) comprises spatial and temporal properties of the wideband spectrum; and
reporting an output comprising an angle-of-arrival (AOA) based on joint space-time spectral estimate (P).

12. The method of claim 11, further comprising forming the array manifold vectors in k-space, each manifold vector having a length (m) corresponding with a number of channels.

13. The method of claim 12, wherein each receive channel comprises a same wideband frequency spectrum, each receive channel is associated with one antenna element of the array of antenna elements, and wherein for each receive channel, the method comprises applying one of the random time delays to the received signals of the associated receive channel.

14. The method of claim 13, further comprising:
computing the inverse (Q) of the joint-space time spectral estimate (P) by projecting the array manifold vectors through the mixing matrix (M) yields; and
inverting the inverse (Q) of the joint-space time spectral estimate (P) to obtain the joint-space time spectral estimate (P).

15. The method of claim 14, further comprising:
forming a sample covariance matrix (Sxx) from the time-delayed samples (Xn); and
inverting the sample covariance matrix to form the mixing matrix (M).

16. The method of claim 15, further comprising identifying signals within the wideband spectrum based on the joint-space time spectral estimate (P).

17. The method of claim 16, further comprising determining an angle-of-arrival (AOA) and determine frequency and bandwidth characteristics of the identified signals based on the joint-space time spectral estimate (P).

18. A non-transitory computer-readable storage medium that stores instructions for execution by processing circuitry to configure the processing circuitry for determining a joint space-time spectral estimate (P) for a wideband spectrum, wherein the instructions configure the processing circuitry to:
provide a random time delay (tn) for each channel of a plurality of receive channels to be applied to received signals by discrete time delay units (TDUs) of delay circuitry to generate time-delayed signals for each receive channel, the received signals received by an array of antenna elements coupled to the delay circuitry;
sample the time-delayed signals for each receive channel to generate time-delayed samples (Xn);
form array manifold vectors based on the random time delays and position of each antenna element in the array of antenna elements;
determine an inverse (Q) of the joint-space time spectral estimate (P) by projecting the array manifold vectors through a mixing matrix (M), the mixing matrix (M) based on the time-delayed samples (Xn),
wherein the joint space-time spectral estimate (P) comprises spatial and temporal properties of the wideband spectrum; and
report an output comprising an angle-of-arrival (AOA) based on joint space-time spectral estimate (P).

19. The non-transitory computer-readable storage medium of claim 18, wherein the processing circuitry is configured to form the array manifold vectors in k-space, each manifold vector having a length (m) corresponding with a number of channels.

20. The non-transitory computer-readable storage medium of claim 19, wherein each receive channel comprises a same wideband frequency spectrum, each receive channel is associated with one antenna element of the array of antenna elements, and wherein for each receive channel, the processing circuitry is configured to apply one of the random time delays to the received signals of the associated receive channel.

\* \* \* \* \*

UNITED STATES PATENT AND TRADEMARK OFFICE
CERTIFICATE OF CORRECTION

PATENT NO. : 11,630,139 B2
APPLICATION NO. : 17/072989
DATED : April 18, 2023
INVENTOR(S) : James M. Bowden Page 1 of 2

It is certified that error appears in the above-identified patent and that said Letters Patent is hereby corrected as shown below:

In the Drawings

Sheet 2 of 5, Fig. 2, and on the title page, the illustrative print figure, reference numeral 208, Line 3, delete "(Sxx)" and insert --($S_{xx}$)-- therefor In the Specification In Column 2, Line 7, delete "(tn)" and insert --($\tau_n$)-- therefor In Column 2, Line 12, delete "(Xn)," and insert --($X_n$),-- therefor In Column 2, Line 20, delete "(Xn)." and insert --($X_n$).-- therefor In Column 2, Line 42, delete "(Sxx)" and insert --($S_{xx}$)-- therefor In Column 2, Line 43, delete "(Xn)" and insert --($X_n$)-- therefor In Column 2, Line 45, delete "(Sxx)" and insert --($S_{xx}$)-- therefor In Column 2, Line 59, delete "(tn)" and insert --($\tau_n$)-- therefor In Column 2, Line 64, delete "(Vn)" and insert --($V_n$)-- therefor In Column 3, Line 3, delete "$t_n$" and insert --$\tau_n$-- therefor In Column 3, Line 10, delete "(tn)" and insert --($\tau_n$)-- therefor In Column 3, Line 15, delete "(Xn)." and insert --($X_n$).-- therefor Signed and Sealed this
Twentieth Day of August, 2024

*Katherine Kelly Vidal*

Katherine Kelly Vidal
*Director of the United States Patent and Trademark Office*

CERTIFICATE OF CORRECTION (continued)
U.S. Pat. No. 11,630,139 B2

In Column 3, Line 22, delete "(Xn)." and insert --($X_n$).-- therefor

In Column 3, Line 34, delete "(Sxx)" and insert --($S_{xx}$)-- therefor

In Column 3, Line 35, delete "(Xn)" and insert --($X_n$)-- therefor

In Column 3, Line 65, delete "$t_n$," and insert --$\tau_n$,-- therefor

In Column 4, Line 12, delete "(Xn)" and insert --($X_n$)-- therefor

In the Claims

In Column 4, Line 48, in Claim 1, delete "(tn)" and insert --($\tau_n$)-- therefor In Column 4, Line 55, in Claim 1, delete "(Xn);" and insert --($X_n$);-- therefor In Column 4, Line 62, in Claim 1, delete "(Xn)," and insert --($X_n$),-- therefor In Column 5, Line 21, in Claim 5, delete "(Sxx)" and insert --($S_{xx}$)-- therefor In Column 5, Line 22, in Claim 5, delete "(Xn);" and insert --($X_n$);-- therefor In Column 5, Line 35, in Claim 8, delete "(tn)" and insert --($\tau_n$)-- therefor In Column 5, Line 38, in Claim 9, delete "(Vn)" and insert --($V_n$)-- therefor In Column 5, Line 44, in Claim 9, delete "$t_n$" and insert --$\tau_n$-- therefor In Column 5, Line 47, in Claim 10, delete "($t_n$)" and insert --($\tau_n$)-- therefor In Column 5, Line 54, in Claim 11, delete "($t_n$)" and insert --($\tau_n$)-- therefor In Column 5, Line 60, in Claim 11, delete "(Xn);" and insert --($X_n$);-- therefor In Column 5, Line 67, in Claim 11, delete "(Xn)," and insert --($X_n$),-- therefor In Column 6, Line 25, in Claim 15, delete "(Sxx)" and insert --($S_{xx}$)-- therefor In Column 6, Line 26, in Claim 15, delete "(Xn);" and insert --($X_n$);-- therefor In Column 6, Line 42, in Claim 18, delete "(tn)" and insert --($\tau_n$)-- therefor In Column 6, Line 50, in Claim 18, delete "(Xn);" and insert --($X_n$);-- therefor In Column 6, Line 57, in Claim 18, delete "(Xn)," and insert --($X_n$),-- therefor